US008203375B2

(12) United States Patent
de Jong et al.

(10) Patent No.: US 8,203,375 B2
(45) Date of Patent: Jun. 19, 2012

(54) FREQUENCY CONVERSION

(75) Inventors: Gerben Willem de Jong, Veldhoven (NL); Johannes Hubertus Antonius Brekelmans, Nederweert (NL)

(73) Assignee: NXP B.V., Eindhoven (NL)

( * ) Notice: Subject to any disclaimer, the term of this patent is extended or adjusted under 35 U.S.C. 154(b) by 44 days.

(21) Appl. No.: 12/889,259

(22) Filed: Sep. 23, 2010

(65) Prior Publication Data

US 2011/0095807 A1    Apr. 28, 2011

(30) Foreign Application Priority Data

Sep. 23, 2009  (EP) .................................... 09252264

(51) Int. Cl.
G06F 7/44    (2006.01)
G06G 7/16    (2006.01)
(52) U.S. Cl. ....................................... 327/359; 327/357
(58) Field of Classification Search .................. 327/359, 327/357
See application file for complete search history.

(56) References Cited

U.S. PATENT DOCUMENTS

| 6,125,272 | A  | * | 9/2000  | Bautista et al. ............... 455/326 |
| 6,242,963 | B1 | * | 6/2001  | Su et al. ........................ 327/359 |
| 6,348,830 | B1 |   | 2/2002  | Rebeiz et al. |
| 7,215,940 | B2 | * | 5/2007  | Goddard et al. .............. 455/326 |
| 7,356,317 | B2 | * | 4/2008  | Xu et al. ........................ 455/130 |
| 7,403,758 | B2 | * | 7/2008  | Rector ......................... 455/232.1 |
| 2005/0164669 | A1 | * | 7/2005 | Molnar et al. ................. 455/320 |
| 2005/0164671 | A1 |   | 7/2005 | Darabi |
| 2005/0221775 | A1 | * | 10/2005 | Abdelli ....................... 455/189.1 |
| 2005/0272394 | A1 | * | 12/2005 | Heck ............................. 455/314 |
| 2006/0135109 | A1 | * | 6/2006  | Klumperink et al. ......... 455/323 |
| 2007/0077907 | A1 | * | 4/2007  | Rector .......................... 455/323 |
| 2008/0139149 | A1 | * | 6/2008  | Mu et al. ..................... 455/200.1 |
| 2009/0029668 | A1 |   | 1/2009  | Hsieh et al. |
| 2009/0270062 | A1 | * | 10/2009 | Mu et al. ....................... 455/323 |
| 2010/0203860 | A1 | * | 8/2010  | Tillman et al. ................ 455/325 |

OTHER PUBLICATIONS

Ru Z, et al.: 'A Software-defined Radio Receiver Architecture Robust to out-of-band Interference,' Solid-State Cirucits Conf., IEEE International, pp. 230-231, (Feb. 8, 2009).
Maxim A, et al. : 'A DDFS Driven Mixing-DAC with Image and Harmonic Rejection Capabilities,' Solid-State Circuits Conf. IEEE International pp. 372-612, (Feb. 2, 2008).
European Extended Search Report for Patent Appln. No. 09252264.8 (Mar. 2, 2010).

* cited by examiner

Primary Examiner — Ryan Jager

(57) ABSTRACT

A frequency conversion circuit configured to mix a first input signal (RF+,RF−) at a first frequency with a second input signal (LO+,LO−) at a second frequency to provide an output intermediate frequency signal ($IF_{out}$), the circuit comprising: first and second mixing modules, each mixing module comprising a voltage to current converter configured to receive the first input signal (RF+,RF−) and connected to a Gilbert mixer configured to receive the second input signal (LO+,LO−); an intermediate frequency output circuit having inputs connected to receive an intermediate frequency current signal (IF+,IF−) from outputs of each of the Gilbert mixers and an output configured to provide the output intermediate frequency voltage signal ($IF_{out}$), wherein the first and second mixing modules comprise transistors which are complementary to each other.

10 Claims, 10 Drawing Sheets

US 8,203,375 B2

FREQUENCY CONVERSION

This application claims the priority of European patent application no. 09252264.8, filed on Sep. 23, 2009, the contents of which are incorporated by reference herein.

BACKGROUND OF THE INVENTION

An integrated active Gilbert mixer typically needs a DC bias current source at the mixer output. The DC bias current source also connects to the IF amplifier input and forms a significant source of low frequency noise, degrading the signal-to-noise ratio (SNR) of the received signal.

An example of an active Gilbert mixer 102 forming part of a mixer circuit 100 is illustrated in FIG. 1. The mixing circuit 100 comprises a voltage to current converter 101 connected to a Gilbert mixer 102. The voltage to current converter 101 comprises a pair of NMOS transistors 103a, 103b having their sources connected across a resistor Rss and to a voltage supply line Vss via respective current sources 104a, 104b, each supplying a bias current Is through the transistors 103a, 103b. The gates of transistors 103a, 103b are connected to two halves of an RF differential input signal, RF+, RF−, and the drains are connected to the Gilbert mixer 102.

The Gilbert mixer 102 comprises two pairs of NMOS transistors 105a, 105b & 106a, 106b, each pair having common sources connected to a drain of a corresponding transistor 103a, 103b in the voltage to current converter 101. Gates of the pairs of transistors 105a, 105b & 106a, 106b are connected to two halves of a differential input signal LO+, LO−, with the gates connected to each half LO+, LO− of the input signal also connected together. The LO signal may be a high frequency signal that may be applied to the LO+, LO− terminals of the mixer 102 through a coupling capacitor.

Drains of the transistors 105a, 105b, 106a, 106b, are connected to provide a differential intermediate frequency output IF+, IF−.

Harmonic rejection mixers can employ a plurality of hard-switching active Gilbert mixers connected in parallel, in order to approximate a sinusoidal effective mixing waveform. Harmonic rejection mixers are advantageously used in wideband radio transceivers such as software-defined radio. The reduced harmonic response allows a saving of RF filtering and therefore better integration. A so-called mixing-DAC, comprising a programmable array of unit mixers, constitutes a flexible and programmable implementation of a harmonic rejection mixer. An example of a harmonic rejection mixer 200 is illustrated in FIG. 2.

The mixer in FIG. 2 is an example of a 10 bit mixing DAC that uses a 5 bit thermometer section 201 together with a 5 bit binary section 202, resulting in 36 mixer units in total. The mixers $203_{1-31}$ making up the thermometer unit 201 have an equal weighting, whereas the mixer units $203_{32-36}$ making up the binary section 202 have weights of ½, ¼, ⅛, ⅟₁₆ and ⅟₃₂ of the input RF signal respectively. Output signals from each of the mixer units $203_{1-36}$ are connected to a summation amplifier 204, and an output signal IFout is provided by the amplifier 204. An exemplary effective mixing waveform 301 resulting from such a mixer is illustrated in FIG. 3, the waveform being a quantized close approximation to a sinusoidal signal.

Compared to passive switching mixers, active Gilbert mixers tend to have somewhat inferior performance with regard to (1/f) noise and intermodulation.

An active mixer stage typically comprises a voltage to current converter 101 (also known as a transconductance amplifier) and a Gilbert mixer 102, as shown in FIG. 1. As the voltage to current converter 101 and mixer 102 are stacked, these blocks can share the same DC bias of 2×Is, which is determined by the two current sources 104a, 104b. The mixer IF output current can be converted into an output voltage using resistors or, more preferably, using a trans-impedance amplifier 401, an example of which is illustrated in the mixer 400 illustrated in FIG. 4, which incorporates the voltage to current converter 101 and Gilbert mixer 102 of FIG. 1. The voltage to current converter 101 may need to be operated at a higher DC bias current than the Gilbert mixer 102. This can be achieved by providing additional DC bias current by means of two optional additional current sources 403a, 403b connected between supply VDD and the drains of the voltage to current converter transistors. The trans-impedance amplifier 401 comprises a differential operational amplifier 403 with feedback resistors Rfb and capacitors Cfb connected across each input and output line.

A trans-impedance amplifier offers a low input impedance, thereby reducing voltage swings at the mixer output and contributing to improved signal handling. The use of a parallel resonance LC tank tuned to the IF frequency in order to convert the mixer output current into an output voltage is less attractive due to the size and associated cost of providing integrated inductors. To prevent suppression of the IF signal, and to prevent noise boosting of the trans-impedance amplifier 401, the DC bias provided by current sources 402a, 402b at the IF output terminals IF+ and IF− should have a high impedance at IF frequencies.

The pair of current sources 402a, 402b, providing currents $I_D$, preferably operate in conjunction with a common mode control loop, as illustrated in the circuit 500 shown in FIG. 5. Different ways may be considered for implementing the DC bias currents, one of which is by means of a pair of degenerated PMOS transistors 601a, 601b, as illustrated in the circuit 600 shown in FIG. 6.

Noise generated by the DC bias current $I_D$ at the IF frequency will directly enter the IF amplifier 401 and thus affect the signal to noise ratio of the down-converted RF signal, $IF_{out}$. For the case of a 10 bit mixing DAC the noise degradation by current sources ID was found to be unacceptably high. With a Mixer-IF amplifier overall voltage conversion gain of 17 dB and a single sideband Noise Figure of 21.4 dB (50Ω source) a (differential) DC current source noise density of 4.2 pA/√Hz or better is required for a maximum of 0.4 dB noise contribution.

The above noise ceiling applies to the DC current source while it delivers 4 mA of DC current, as required by the 36 mixer cells that constitute the 10 bit mixing DAC shown in FIG. 2. The noise density of 4.2 pA/√Hz equals the noise current produced in a 2×470Ω resistor. Lower noise requires a larger resistor, but a resistor of 470Ω carrying 4 mA already creates a DC voltage drop of 1.88V. The presence of a PMOS transistor 601a, 601b as shown in FIG. 6 will tend to add additional thermal and 1/f noise while further reducing the DC headroom available for the degeneration resistor 602a, 602b. Despite large area transistors and resistors, the simulated noise of such an implementation, as illustrated by the trace 701 in FIG. 7, is far beyond the desired noise requirement at 1 MHz, indicated by line 702. Occupying a reasonable 0.7 V DC headroom, the noise amounts to 16.2 pA/√Hz in the flat part of the trace 701 (above around 10 MHz) and is 21.2 pA/·Hz at f=1 MHz.

What is needed therefore is a Gilbert-cell mixer having a DC load section that does not occupy considerable voltage headroom and yet does not add a significant amount of noise to the output.

The noise of the IF bias circuit 600 (FIG. 6) flowing directly into the IF amplifier 401 (FIG. 5) is distinct from the noise at IF frequencies generated by the bias current sources 104a, 104b (FIG. 1) in RF section 101 of the mixer 100. IF noise generated in the current $I_s$ is attenuated by commutation of the Gilbert mixer 102 inherent to the mixing process. Assuming a low frequency waveform with an accurate 50% duty cycle and a switching frequency $f_{LO}$ much higher than the IF frequency, this attenuation would be infinite if not for some circuit mismatch. In practice however, the noise contributed by $I_s$ can be neglected compared to the noise generated by the bias current source $I_D$. The noise requirements of bias current source $I_D$ can be relaxed by applying commutation. Commutation is effective in attenuating the low frequency noise, but has the disadvantage of potentially introducing an unwanted spurious signal if applied with a frequency different from the mixing frequency.

It is an object of the invention to address one or more of the above mentioned problems.

SUMMARY OF THE INVENTION

According to the invention there is provided a frequency conversion circuit configured to mix a first input signal at a first frequency with a second input signal at a second frequency to provide an output intermediate frequency signal, the circuit comprising:
- first and second mixing modules, each mixing module comprising a voltage to current converter configured to receive the first input signal and connected to a Gilbert mixer configured to receive the second input signal;
- an intermediate frequency output circuit having inputs connected to receive an intermediate frequency current signal from outputs of each of the Gilbert mixers and an output configured to provide the output intermediate frequency voltage signal,
- wherein the first and second mixing modules comprise transistors which are complementary to each other. In other words, the transistors of the first mixing module are of a polarity that is complementary (or opposite) to the transistors of the second mixing module.

BRIEF DESCRIPTION OF THE DRAWINGS

The invention is described in further detail below by way of example, and with reference to the accompanying drawings, in which.

DETAILED DESCRIPTION

The intermediate frequency output circuit may be an intermediate frequency amplifier, or alternatively could comprise a resistor network.

The voltage to current converter and Gilbert mixer of each mixing module are preferably configured to share a common DC bias current. This reduces the noise contribution of the circuit.

The inputs of each voltage to current converter are preferably AC coupled to the first input signal, to enable an optimal DC biasing of the first and second voltage to current converter.

The transistors are typically CMOS transistors of PMOS and NMOS type, although implementations using bipolar junction transistors may be envisaged. By introducing complementary N type and P type active Gilbert mixers, the above mentioned problems relating to a DC bias current source can be avoided. The proposed mixer structure therefore has much better noise properties, and can, for example, advantageously be used as a building block in harmonic rejection mixers.

The Gilbert mixers of each mixing module may comprise two pairs of transistors, a gate of a first one of each pair configured to receive a positive half of the second input signal and a gate of a second one of each pair configured to receive a negative half of the second input signal, the gates of the first one and the second one of each pair being connected to each other, the sources of each pair being connected to each other and connected to respective outputs of the voltage to current converter and the drains of each pair connected to the intermediate frequency output circuit.

The voltage to current converter of each mixing module may comprise a pair of transistors each having a drain connected to one of the pairs of transistors of the connected Gilbert mixer, a gate configured to receive one half of the first input frequency signal and a source connected to a voltage supply line via a current source, the source connections of the pair of transistors being connected together across a resistor.

An application of the frequency conversion circuit is in a harmonic rejection mixer comprising a plurality of the first and second mixing modules of the frequency conversion circuit, in which each complementary pair of mixing modules is configured to receive a portion of the first input signal, and the intermediate frequency output circuit is a summation amplifier configured to receive outputs from each complementary pair of mixing modules and provide the output intermediate frequency signal representing a sum of the intermediate frequency signals from the pairs of mixing modules.

Figure 8:
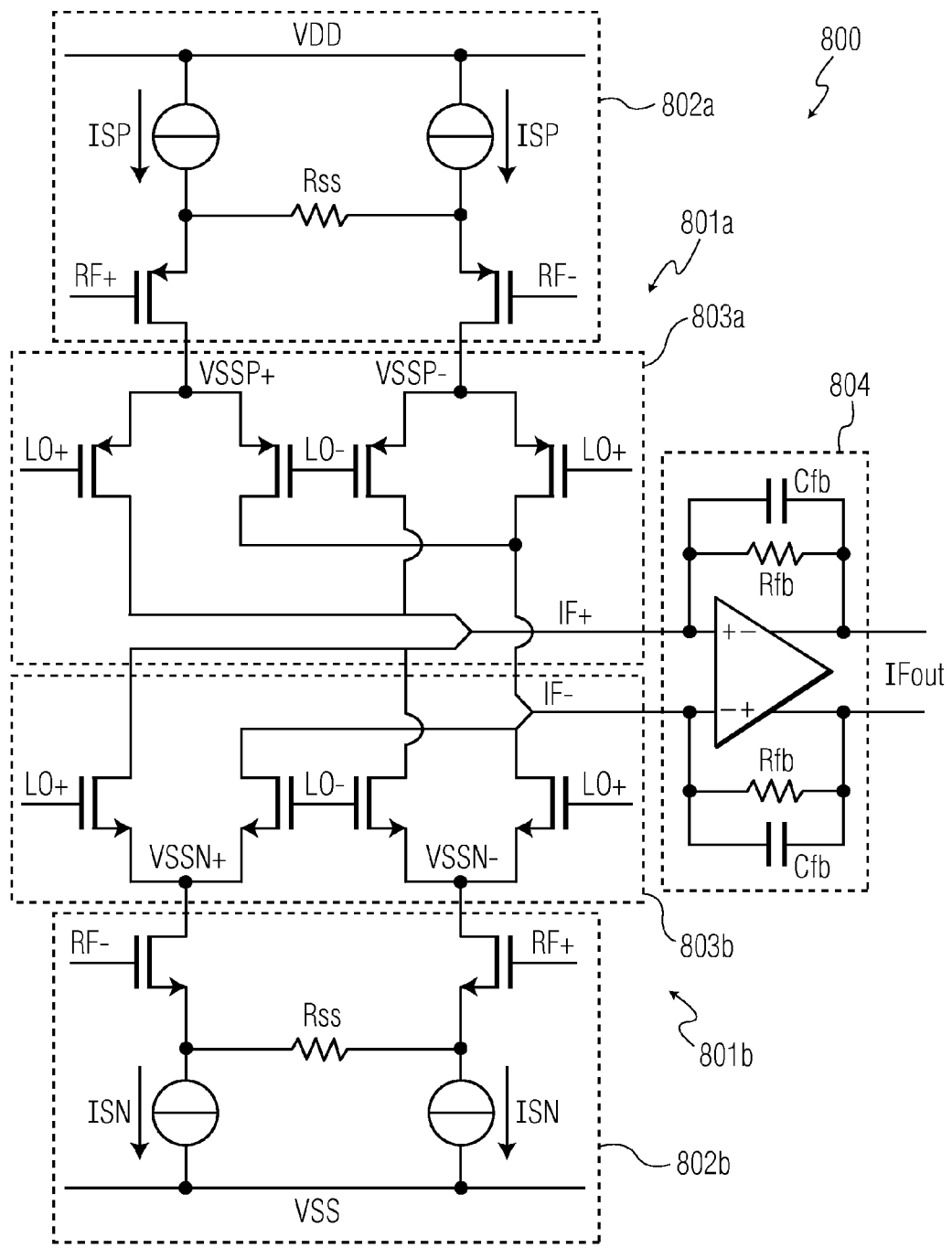
FIG. 8 is a circuit diagram of a complementary active mixer with IF amplifier.

A new mixer topology is proposed that solves the problem of signal to noise degradation by the IF bias current source, an exemplary embodiment of which is the mixer circuit 800 illustrated in FIG. 8. In the circuit 800, two complementary mixers 801a, 801b each contribute one half of the IF output signal IF+, IF−, while their DC bias currents are re-used. A common mode control loop (not shown) can be applied to maintain correct balance of DC currents of the PMOS mixer section 801a and the NMOS mixer section 801b. The RF input terminals of the PMOS and NMOS mixer sections 801a, 801b are preferably AC coupled. This configuration avoids the need for DC bias current sources to be connected directly to the IF amplifier, and therefore reduces or eliminates the noise associated with such DC bias current sources.

Figure 1:
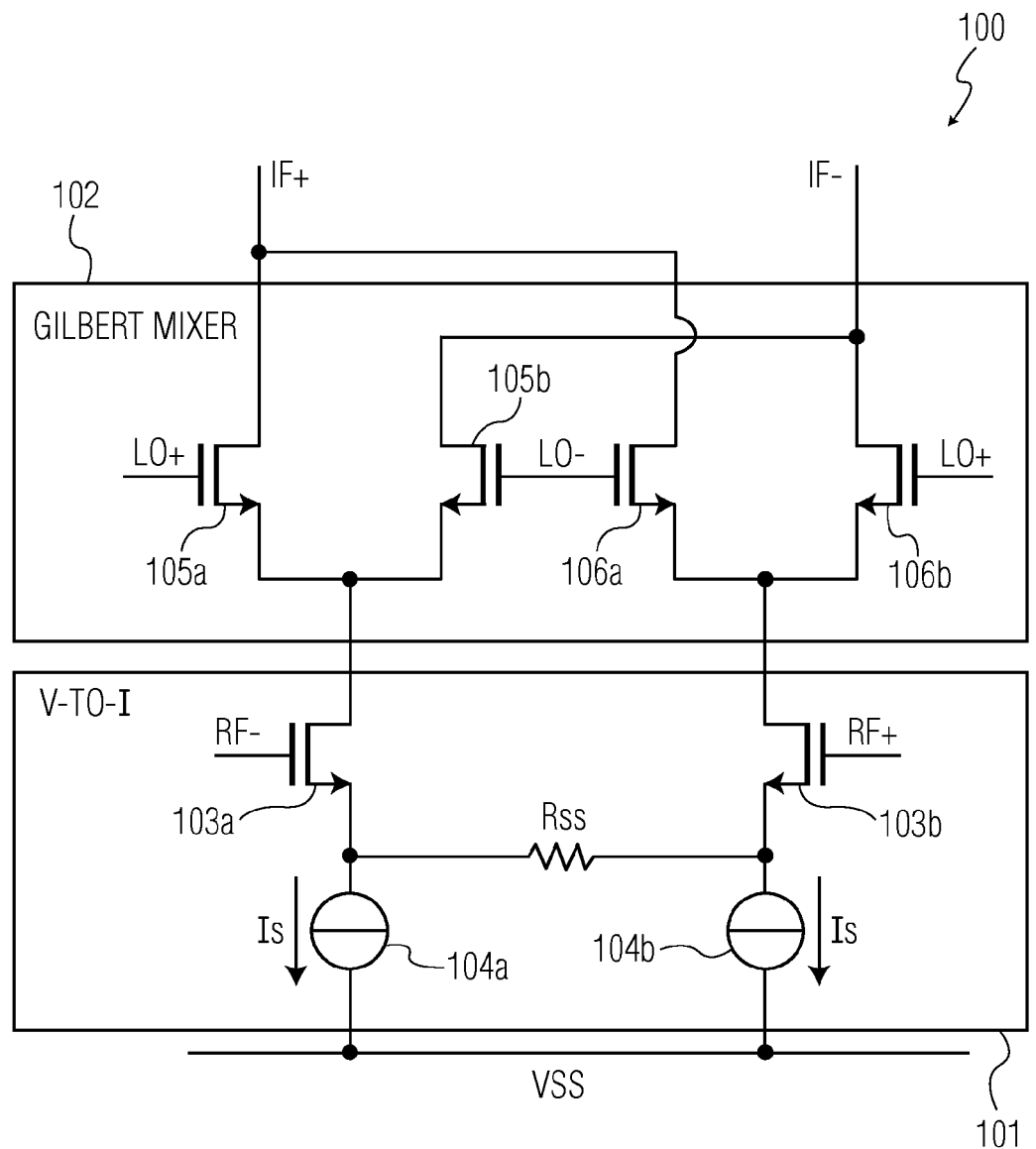
FIG. 1 is a circuit diagram of an active mixer with NMOS transistors.
Figure 2:
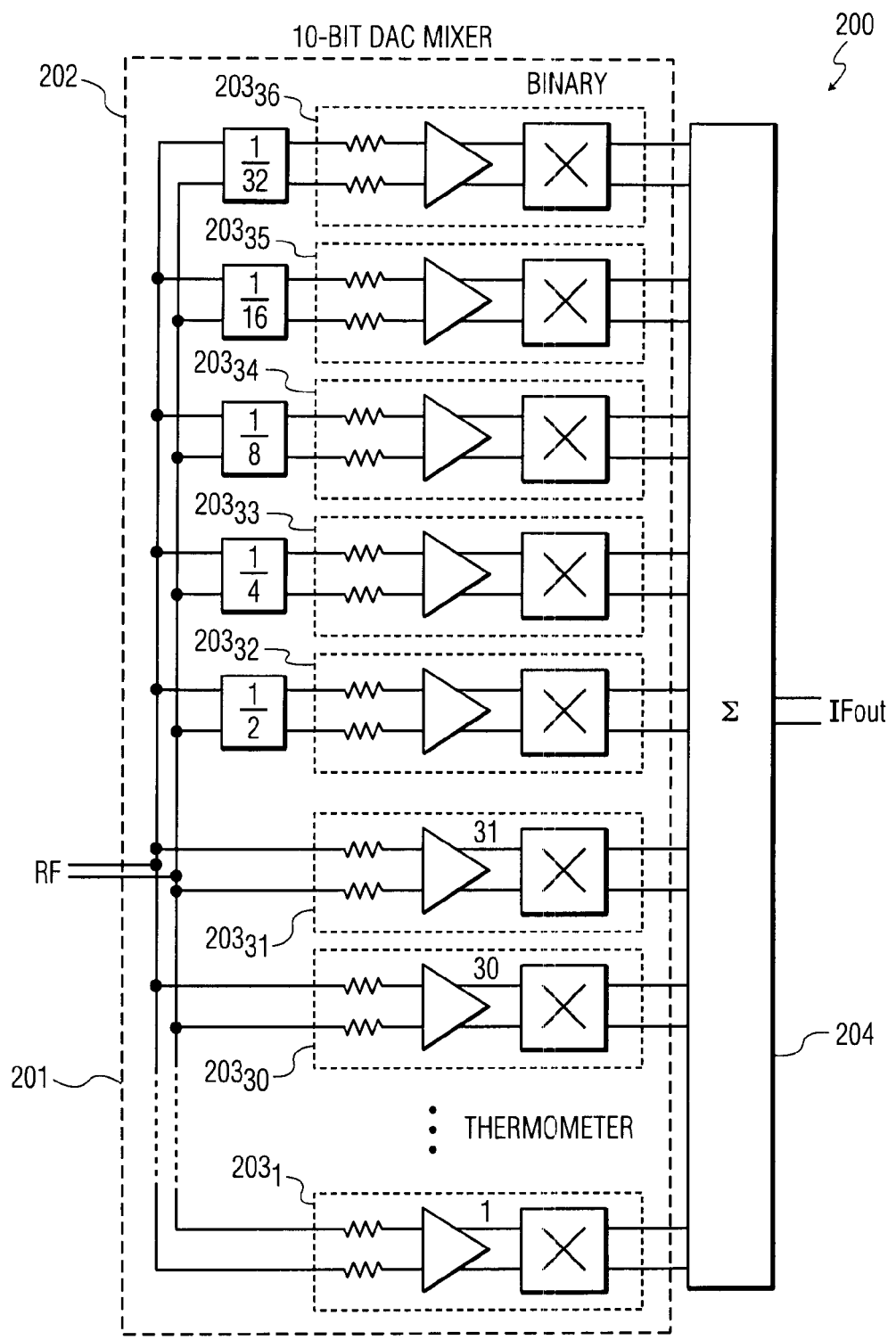
FIG. 2 is a circuit diagram of a 10-bit DAC comprising a number of the active mixer unit cells of FIG. 1.
Figure 3:
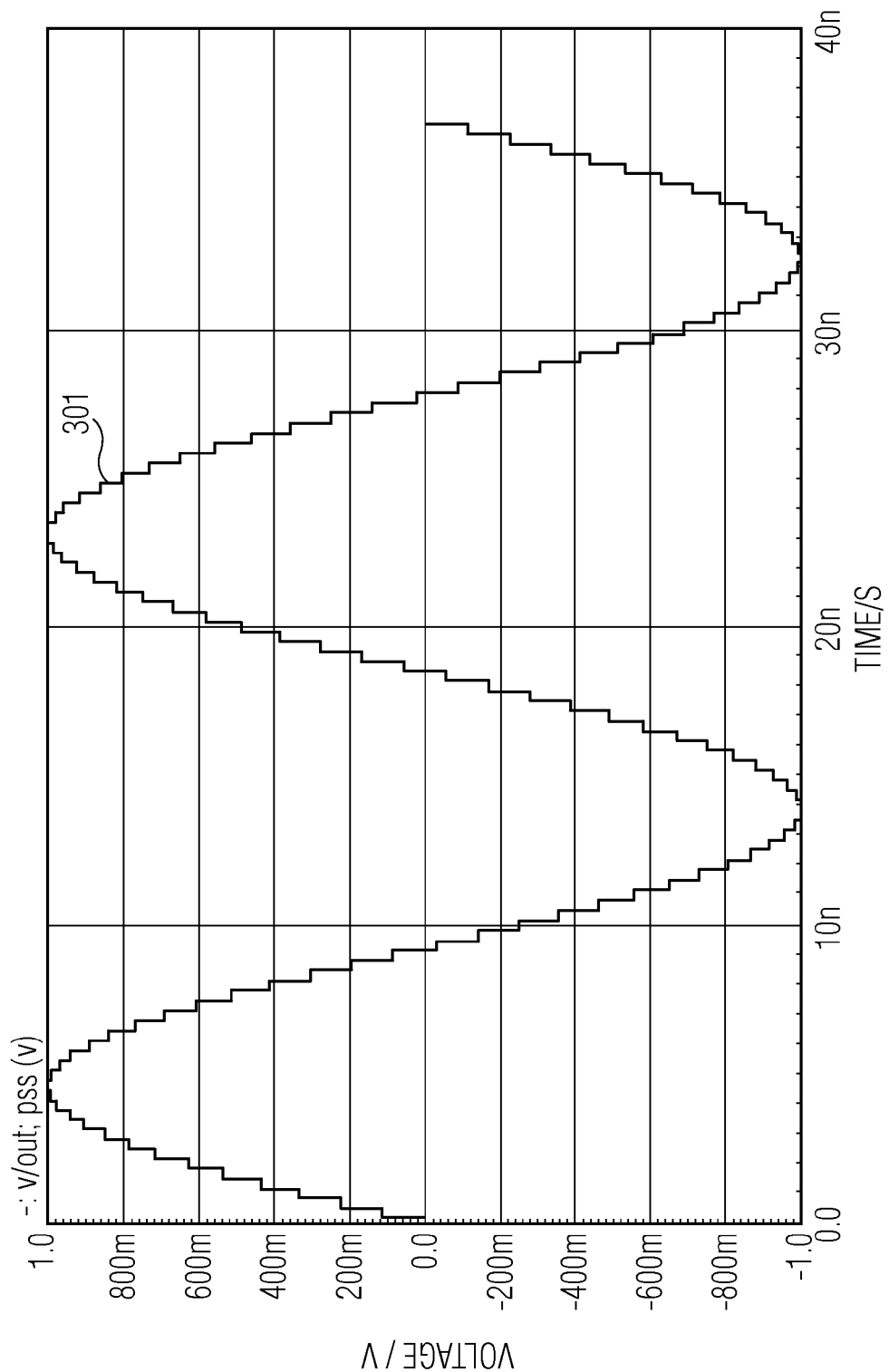
FIG. 3 is a plot of an effective mixing waveform realisable with a 10-bit mixing DAC of the type shown in FIG. 2.
Figure 4:
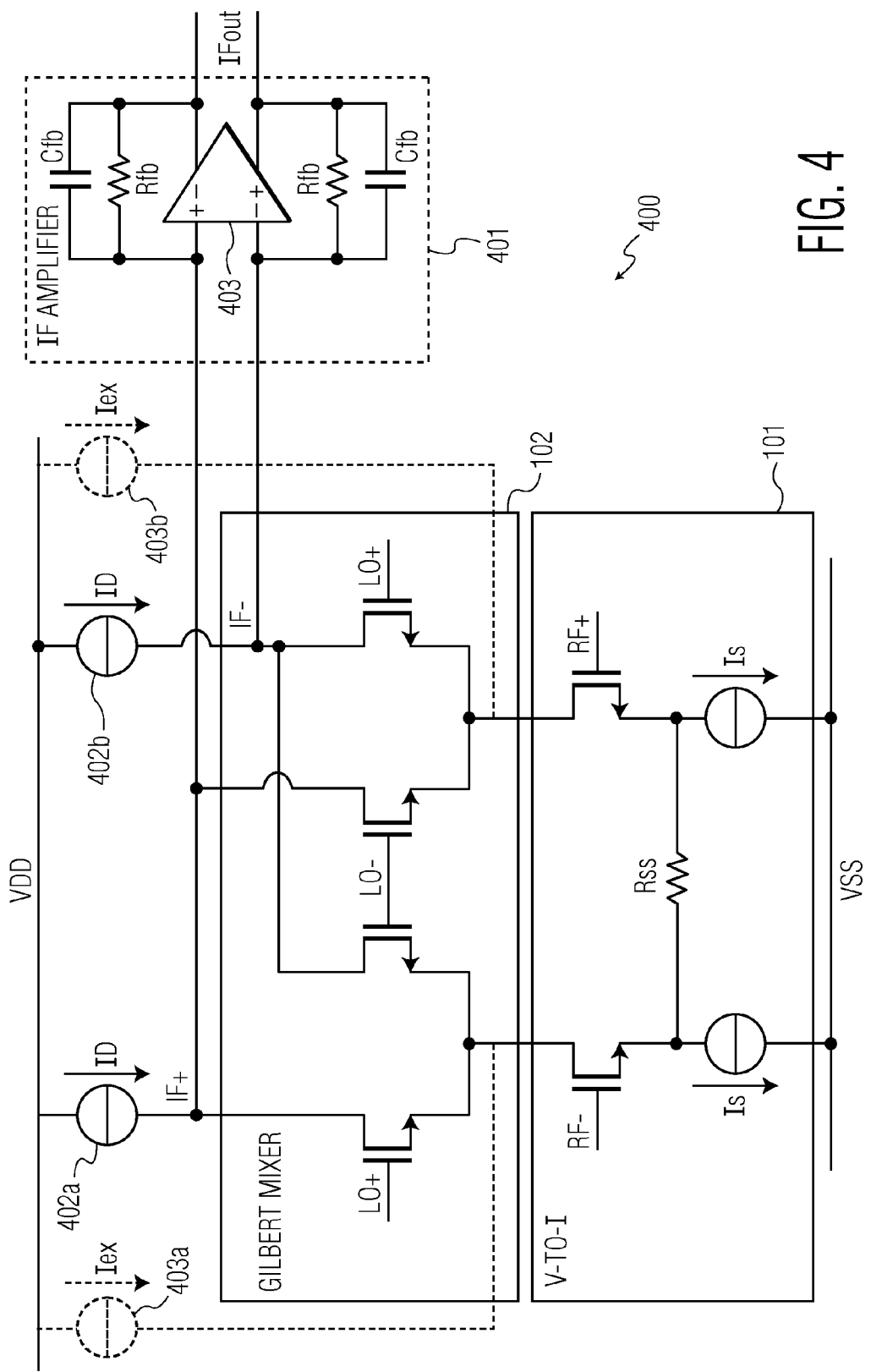
FIG. 4 is a circuit diagram of a single active mixer having DC bias current sources and an IF amplifier.
Figure 5:
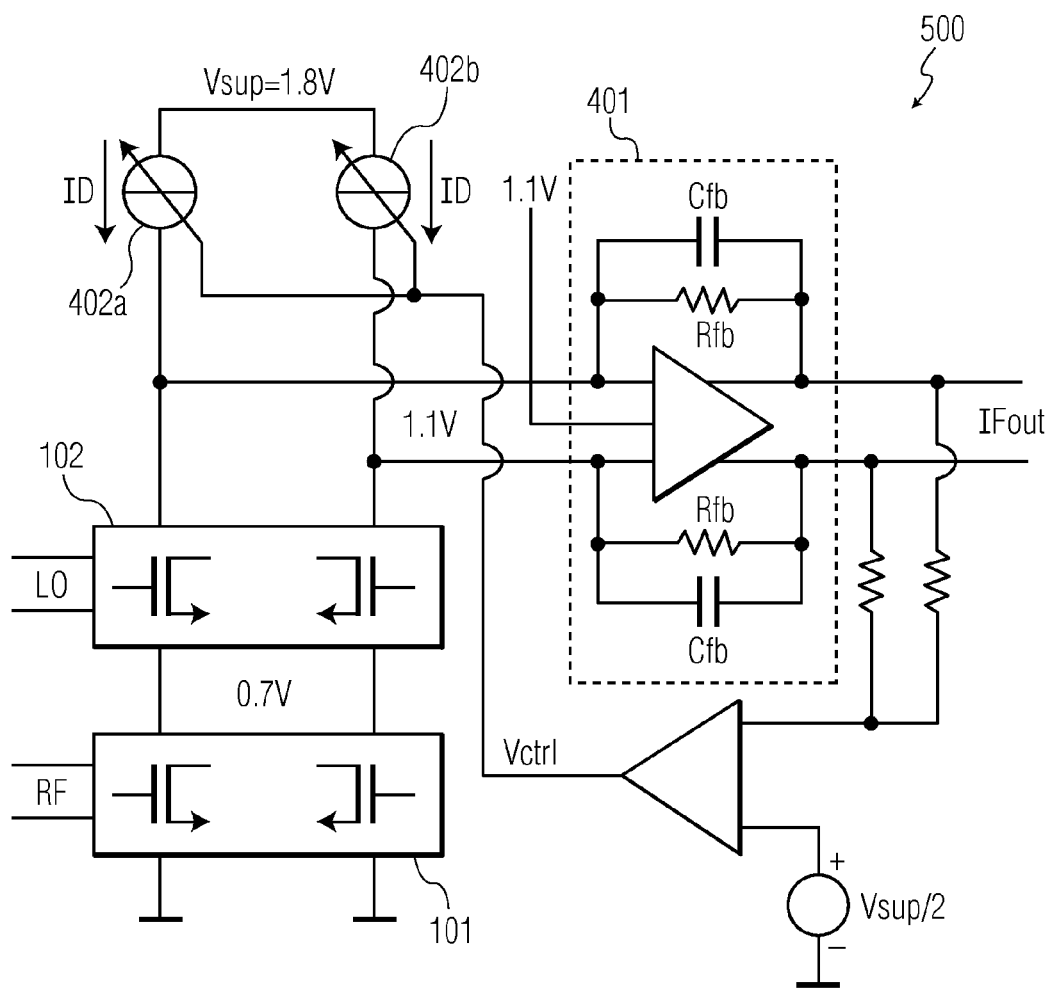
FIG. 5 is a circuit diagram of a single active mixer having a controlled DC bias and an IF amplifier.
Figure 6:
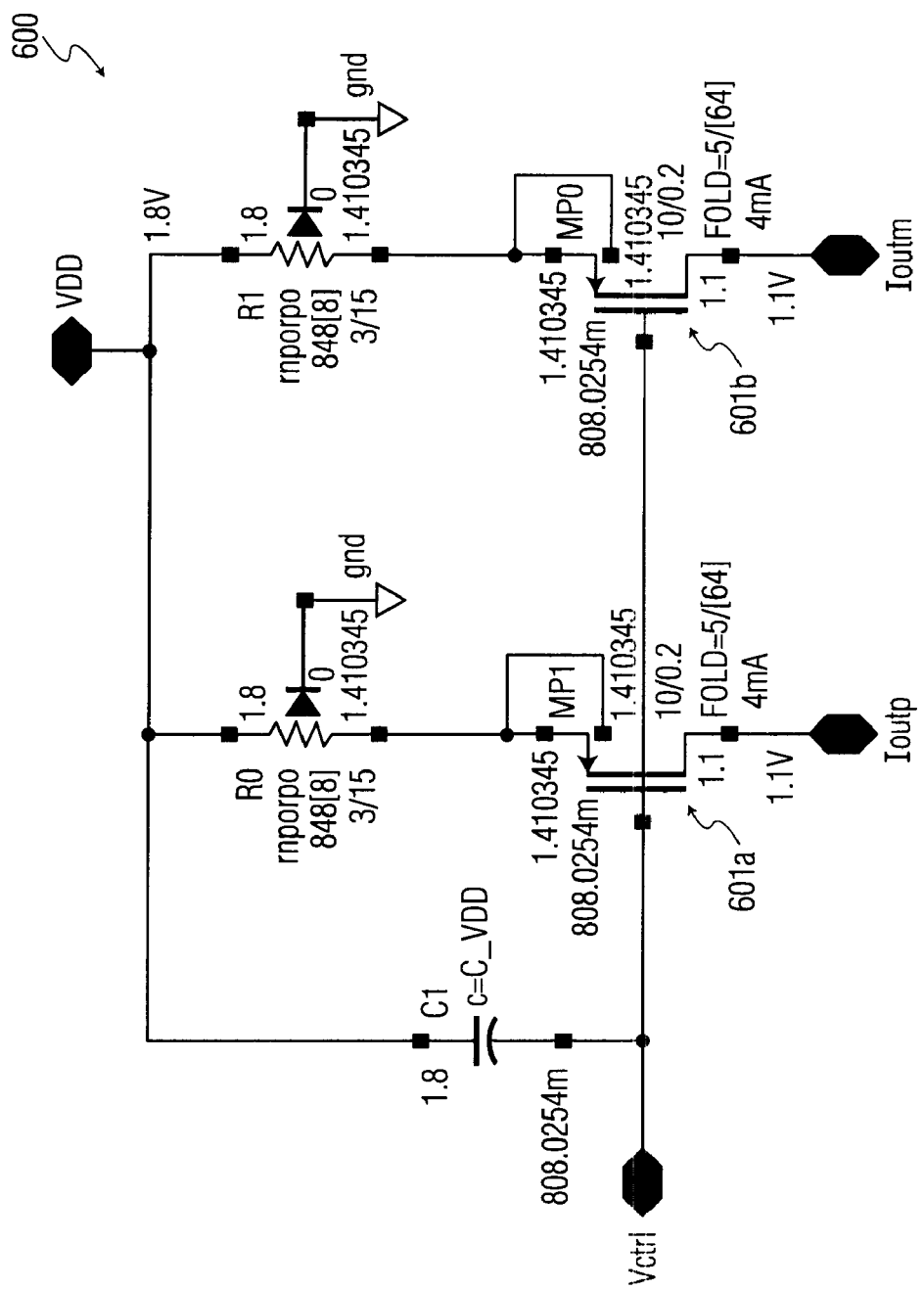
FIG. 6 is a circuit diagram of an exemplary embodiment of a pair of PMOS current sources in CMOS065, each PMOS delivering approximately 4 mA of DC current.
Figure 7:
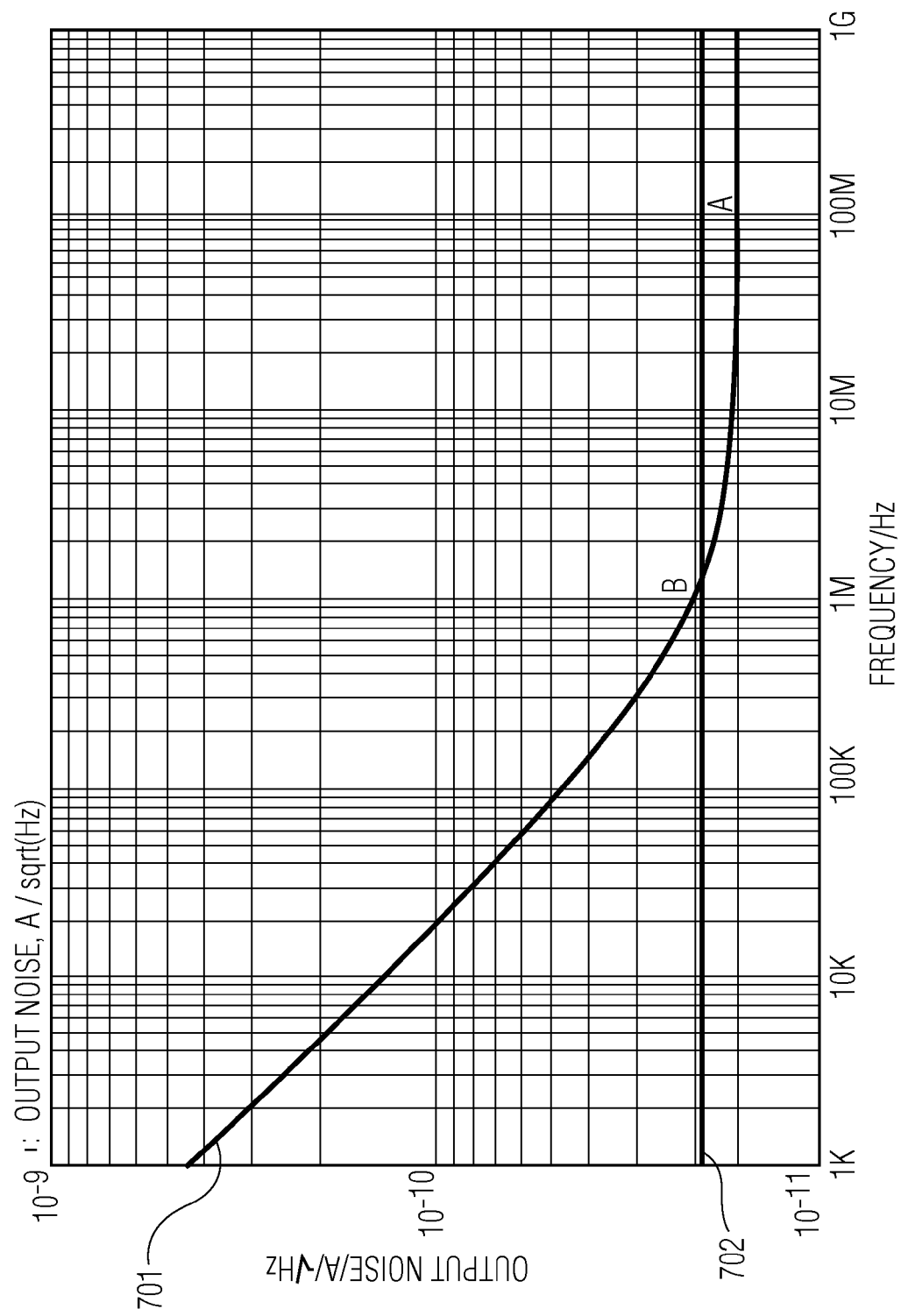
FIG. 7 is a plot of differential current noise produced by the circuit according to FIG. 6.

Application of the optional additional DC bias current into the voltage to current converters, as illustrated in FIG. 4, is also feasible when using two pairs of complementary current sources. When accounting for presence of additional current sources the DC bias currents at the output of the Gilbert mixers 803a, 803b may be balanced but not necessarily the currents through the complementary voltage to current converters 802a, 802b. In some embodiments, the voltage to current converters 802a, 802b and Gilbert mixers 803a, 803b do not operate at the same DC bias current, and the DC bias currents of the p and n type voltage to current converters 802a, 802b may need to be chosen differently.

A possible disadvantage of the complementary topology illustrated in FIG. 8 is the required increase of supply voltage to make room for the P-type Gilbert mixer 803a and voltage to current converter 802a. However, the required headroom is only slightly larger than the headroom needed by the DC bias current source, and the re-use of DC bias currents between complementary devices results in an overall improved power efficiency.

Figure 9:
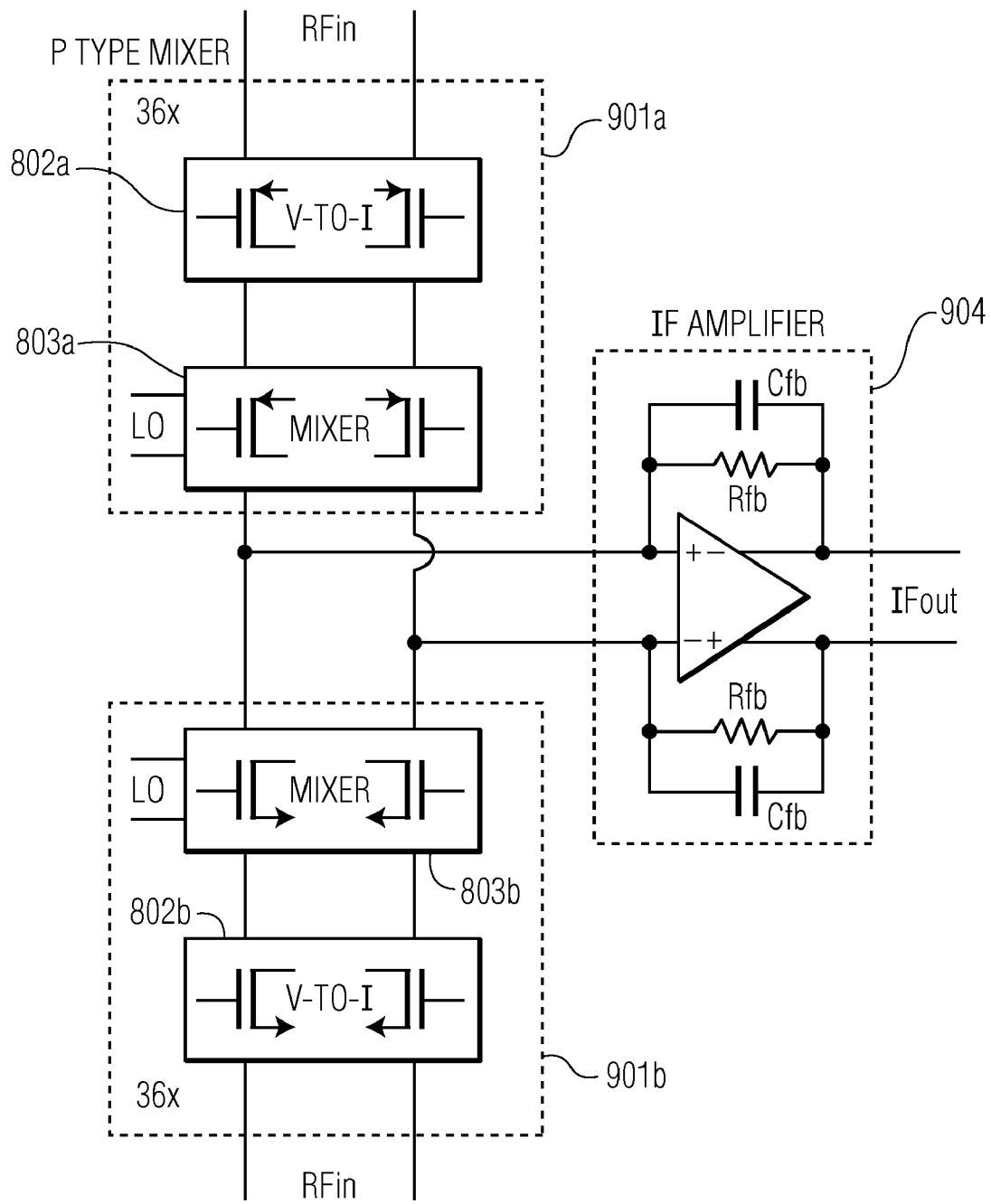
FIG. 9 is a circuit diagram of a complementary 10-bit mixing DAC with IF summation amplifier.

For a multi-bit mixing DAC, multiple PMOS and NMOS Gilbert mixers can be DC connected to the same signal pair LO+ and LO−, as shown in the exemplary mixing DAC circuit 900 illustrated in FIG. 9. Outputs from the mixing modules 901a, 901b are connected to a summing IF amplifier 904 to provide the output signal $IF_{out}$.

A critical characteristic of an active Gilbert mixer when used as part of a mixing-DAC is timing accuracy. Before being applied to the mixer the LO signal is re-timed by a master clock using a latch. Timing accuracy is defined as the delay between the arrival of the clock state transition and a resulting mixer output state transition. A timing mismatch affects the spectral purity of a generated mixing waveform that comprises a large number of these state transitions. The timing accuracy is determined by variations in propagation delays of the latch and the mixer cell and through RC time constants relating to circuit parameters like transistor threshold voltage and transistor gain. Using complementary PMOS and NMOS mixers, with each mixer providing half of the original signal current, increases the LO terminal capacitance by 50% as the size of the PMOS transistors are preferably chosen to be approximately twice the size of the NMOS transistors in order to compensate for differences in mobility of N and P type semiconductor materials. Despite this 50% increase of load capacitance, and with no change in the LO drive impedance, a mismatch analysis showed timing mismatch staying approximately the same, probably due to a statistical averaging over 8 devices instead of 4 devices.

Figure 10:
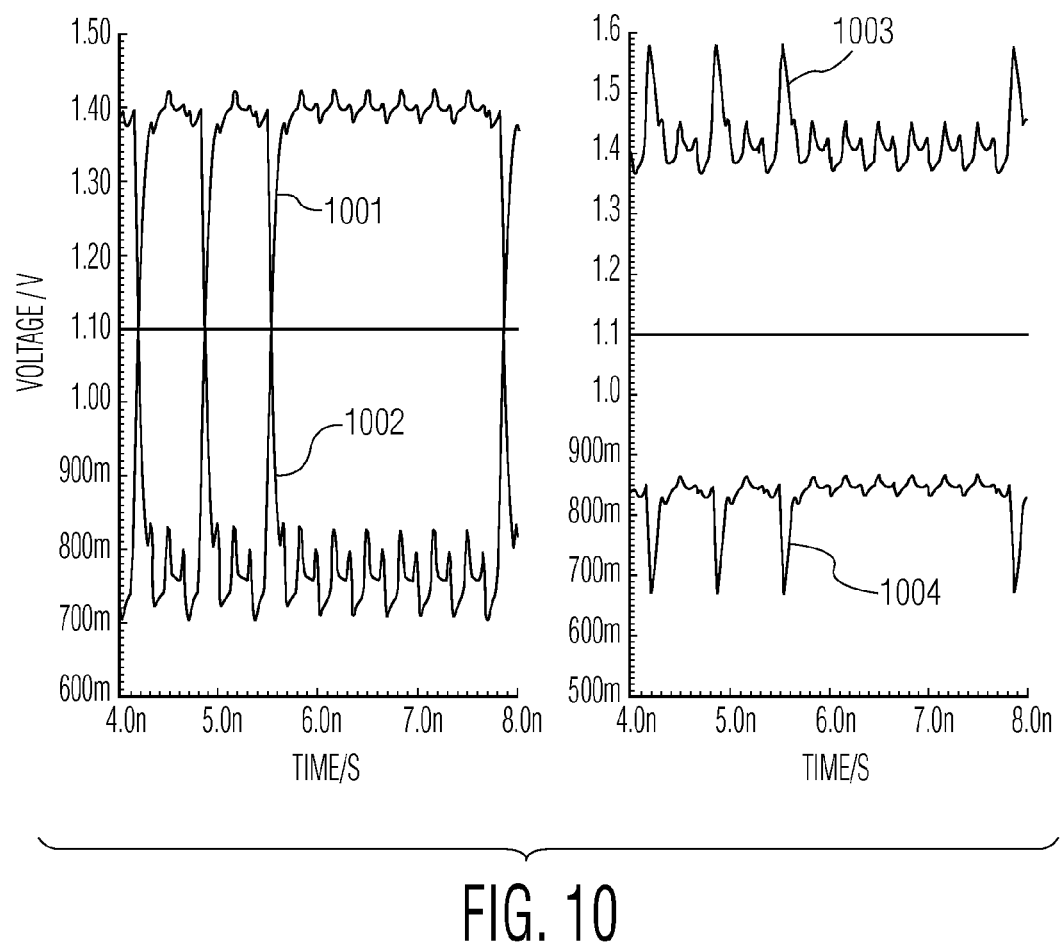
FIG. 10 is a pair of plots of LO+ and LO− (left) with the resulting signal swing on VSSP and VSSN (right).

Shown in FIG. 10 are simulation results of LO+ and LO− (signal traces 1001, 1002) and a resulting signal swing on VSSP and VSSN (signal traces 1003, 1004). The LO swing is 2×0.65 Vp (0.75V to 1.4V). At the output, the mixers connect to an IF amplifier with a common mode DC level of 1.1V.

Other embodiments are intentionally within the scope of the invention as defined by the appended claims.

The invention claimed is:

1. A frequency conversion circuit configured to mix a first input signal (RF+,RF−) at a first frequency with a second input signal (LO+,LO−) at a second frequency to provide an output intermediate frequency signal ($IF_{out}$), the circuit comprising:
    first and second mixing modules, each mixing module comprising a voltage to current converter configured to receive the first input signal (RF+,RF−) and connected to a Gilbert mixer configured to receive the second input signal (LO+,LO−);
    an intermediate frequency output circuit having inputs connected to receive an intermediate frequency current signal (IF+,IF−) from outputs of each of the Gilbert mixers and an output configured to provide the output intermediate frequency voltage signal ($IF_{out}$),
    wherein the first and second mixing modules comprise transistors which are complementary to each other.

2. The circuit of claim 1 wherein the intermediate frequency output circuit is an intermediate frequency amplifier.

3. The circuit of claim 1 wherein the Gilbert mixers in the first and second mixing modules are configured to share a common DC bias current.

4. The circuit of claim 3 wherein the voltage to current converters of the first and second mixing modules are configured to share the common DC bias current.

5. The circuit of claim 1 wherein the inputs of each Gilbert mixer are AC coupled to the first input signal.

6. The circuit of claim 1 wherein the transistors are CMOS transistors of PMOS and NMOS type.

7. The circuit of claim 6 wherein the Gilbert mixers of each mixing module comprise two pairs of transistors, a gate of a first one of each pair configured to receive a positive half (LO+) of the second input signal and a gate of a second one of each pair configured to receive negative half (LO−) of the second input signal, the gates of the first one and the second one of each pair being connected to each other, the sources of each pair being connected to each other and connected to respective outputs of the voltage to current converter and the drains of each pair connected to the intermediate frequency output circuit.

8. The circuit of claim 7 wherein the gates of the first one and the second one of each pair of transistors in the Gilbert mixers of each mixing module are DC coupled to each other.

9. The circuit of claim 1 wherein the voltage to current converter of each mixing module comprises a pair of transistors each having a drain connected to one of the pairs of transistors of the connected Gilbert mixer, a gate configured to receive one half of the first input frequency signal (RF+, RF−) and a source connected to a voltage supply line via a current source, the source connections of the pair of transistors being connected together across a resistor.

10. A harmonic rejection mixer comprising the circuit of claim 1, the mixer comprising a plurality of said first and second mixing modules, each complementary pair of mixing modules configured to receive a portion of the first input signal, the intermediate frequency output circuit being a summation amplifier configured to receive outputs from each complementary pair of mixing modules and provide the output intermediate frequency signal representing a sum of the intermediate frequency signals from the pairs of mixing modules.

* * * * *